(12) United States Patent
Liu

(10) Patent No.: US 9,093,154 B2
(45) Date of Patent: Jul. 28, 2015

(54) METHOD, MEMORY CONTROLLER AND SYSTEM FOR READING DATA STORED IN FLASH MEMORY

(75) Inventor: Wen-Kai Liu, Xinfeng Township, Hsinchu County (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 827 days.

(21) Appl. No.: 13/351,143

(22) Filed: Jan. 16, 2012

(65) Prior Publication Data

US 2013/0182503 A1    Jul. 18, 2013

(51) Int. Cl.
*G11C 29/00* (2006.01)
*G11C 16/06* (2006.01)
*G11C 11/56* (2006.01)
*G11C 16/34* (2006.01)

(52) U.S. Cl.
CPC ............ *G11C 16/06* (2013.01); *G11C 11/5642* (2013.01); *G11C 16/3418* (2013.01)

(58) Field of Classification Search
CPC .... G11C 16/04; G11C 11/5642; G11C 16/06; G11C 16/3418
USPC .............. 365/185.03; 711/103; 714/755, 805, 714/763, 767, 773
See application file for complete search history.

(56) References Cited

U.S. PATENT DOCUMENTS

| | | | |
|---|---|---|---|
| 8,112,689 B2 * | 2/2012 | Hong et al. | 714/755 |
| 8,788,905 B2 * | 7/2014 | Lee et al. | 714/763 |
| 2010/0138594 A1 * | 6/2010 | Huang | 711/103 |
| 2011/0216588 A1 * | 9/2011 | Kim et al. | 365/185.03 |
| 2011/0219288 A1 * | 9/2011 | Kim et al. | 714/805 |

* cited by examiner

*Primary Examiner* — David Ton
(74) *Attorney, Agent, or Firm* — McClure, Qualey & Rodack, LLP

(57) ABSTRACT

An exemplary method for reading data stored in a flash memory is disclosed. The flash memory comprises a plurality of memory cells and stores N bit(s) data in a memory cell of the memory cells by programming the memory cell to one voltage state of 2N voltage states. The method includes: controlling the flash memory to perform at least one read operation upon the memory cell to obtain at least one binary digit for representing a bit of the N bits data; generating a codeword for representing the bit of the N bits data according to the at least one binary digit, wherein the codeword is different from the at least one binary digit; providing the codeword to an error correction decoder for performing an error correction operation.

18 Claims, 10 Drawing Sheets

| | Hard Information | Strength High | Strength Low | Message meaning |
|---|---|---|---|---|
| $V_{LSB}+3D$ | 0 | 1 | 1 | very strong 0 |
| $V_{LSB}+2D$ | | 1 | 1 | strong 0 |
| $V_{LSB}+D$ | | 0 | 1 | weak 0 |
| $V_{LSB}$ | | 0 | 0 | very weak 0 |
| $V_{LSB}-D$ | | 0 | 0 | very weak 1 |
| $V_{LSB}-2D$ | | 0 | 1 | weak 1 |
| $V_{LSB}-3D$ | 1 | 1 | 0 | strong 1 |
| | | 1 | 1 | very strong 1 |

METHOD, MEMORY CONTROLLER AND SYSTEM FOR READING DATA STORED IN FLASH MEMORY

BACKGROUND OF THE INVENTION

1. Field of the Invention

The disclosed embodiments of the present invention relate to reading data stored in a flash memory, and more particularly, to a method and memory controller for reading data stored in a flash memory by referring to binary digit distribution characteristics of bit sequences read from memory cells of the flash memory.

2. Description of the Related Art

Flash memory can be electrically erased and programmed for data storage. It is widely used in memory cards, solid-state drives, portable multimedia players, etc. As the flash memory is a non-volatile memory, no power is needed to maintain the information stored in the flash memory. Besides, the flash memory offers fast read access and better shock resistance. These characteristics explain the popularity of the flash memory.

The flash memories may be categorized into NOR-type flash memories and NAND-type flash memories. Regarding the NAND flash memory, it has reduced erasing and programming time and requires less chip area per cell, thus allowing greater storage density and lower cost per bit than the NOR flash memory. In general, the flash memory stores data in an array of memory cells made from floating-gate transistors. Each memory cell can store one bit of information or more than one bit of information by adequately controlling the number of electrical charge on its floating gate to configure the threshold voltage required for turning on the memory cell made of a floating-gate transistor. In this way, when one or more predetermined control gate voltages are applied to a control gate of the floating-gate transistor, the conductive status of the floating-gate transistor would indicate the binary digit(s) stored by the floating-gate transistor.

However, due to certain factors, the number of electrical charge originally stored on one flash memory cell may be affected/disturbed. For example, the interference presented in the flash memory may be originated from write (program) disturbance, read disturbance, and/or retention disturbance. Taking a NAND flash memory including memory cells each storing more than one bit of information for example, one physical page includes multiple logical pages, and each of the logical pages is read by using one or more control gate voltages. For instance, regarding one flash memory cell which is configured to store three bits of information, the flash memory cell may have one of eight possible states (i.e., electrical charge levels) corresponding to different electrical charge amounts (i.e., different threshold voltages), respectively. However, due to the increase of the program/erase (P/E) count and/or the retention time, the threshold voltage distribution of memory cells in the flash memory may be changed. Thus, using original control gate voltage setting (i.e., threshold voltage setting) to read the stored bits from the memory cell may fail to obtain the correct stored information due to the changed threshold voltage distribution.

Using different control gate voltage setting to read the flash memory may have a higher possibility to obtain the correct stored information. However, storing all the information obtained by using different control gate voltage setting may require more memory space.

BRIEF SUMMARY OF THE INVENTION

In accordance with exemplary embodiments of the present invention, a method for reading data stored in a flash memory by encoding binary digits obtained from read operations is proposed to solve the above-mentioned problem.

According to an aspect of the present invention, an exemplary method for reading data stored in a flash memory is disclosed. The flash memory comprises a plurality of memory cells and stores N bit(s) data in a memory cell of the memory cells by programming the memory cell to one voltage state of 2N voltage states. The method includes: controlling the flash memory to perform at least one read operation upon the memory cell to obtain at least one binary digit for representing a bit of the N bits data; generating a codeword for representing the bit of the N bits data according to the at least one binary digit, wherein the codeword is different from the at least one binary digit; providing the codeword to an error correction decoder for performing an error correction operation.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The invention can be more fully understood by reading the subsequent detailed description and examples with references made to the accompanying drawings, wherein:

FIG. 10 is an exemplary diagram illustrating a mapping relation of the codeword and the threshold voltage of a memory cell.

DETAILED DESCRIPTION OF THE INVENTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Please note that reading multiple bits stored by memory cells of one physical page in a NAND-type flash memory is taken as an example for illustrating technical features of the present invention. However, no matter whether the flash memory is a NAND-type flash memory or a flash memory of other type (e.g., a NOR-type flash memory), the spirit of the present invention is obeyed as long as binary digits of a memory cell obtained in different read operations being encoded as a codeword for performing an error correction operation.

Figure 1:
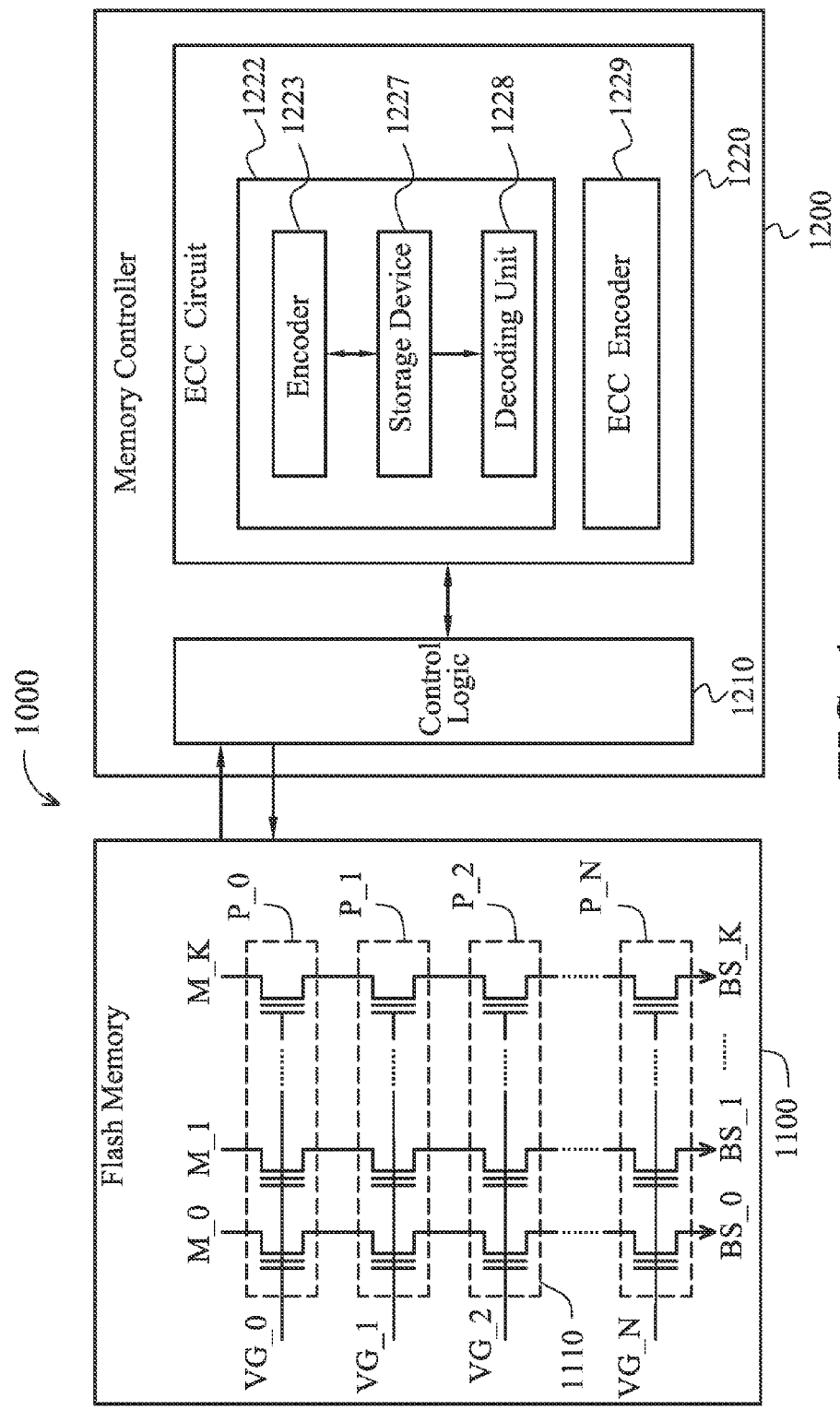
FIG. 1 is a diagram illustrating a memory system according to a first exemplary embodiment of the present invention.

Please refer to FIG. 1, which is a diagram illustrating a memory system according to a first exemplary embodiment of the present invention. The exemplary memory system 1000 includes a flash memory 1100 and a memory controller 1200. In this exemplary embodiment, the flash memory 1100 may be a NAND-type flash memory including a plurality of physical pages P_0, P_1, P_2, ..., P_N, wherein each of the physical pages P_0-P_N includes a plurality of memory cells (e.g., floating-gate transistors) 1110. For example, as to a target physical page P_0 to be read, it has memory cells M_0-M_K included therein. To read the data stored in the memory cells M_0-M_K of the target physical page P_0 the control gate voltages VG_0-VG_N should be properly set. For example, the control gate voltages VG_1-VG_N should be properly set to ensure that all of the memory cells (floating-gate transistors) 1110 of the physical pages P_1-P_N are conductive. In a case where each of the memory cell 1110 is configured to store N bits (e.g., three bits including a least significant bit (LSB), a central significant bit (CSB), and a most significant bit (MSB)), the flash memory 1100 sets the control gate voltage VG_0 to (2N−1) voltage levels for identifying all of the N bits of each memory cell 1110 of the target physical page P_0. In other words, each of the memory cell 1110 can be programmed to one voltage state of 2N voltage states for storing N bits data.

Figure 2:
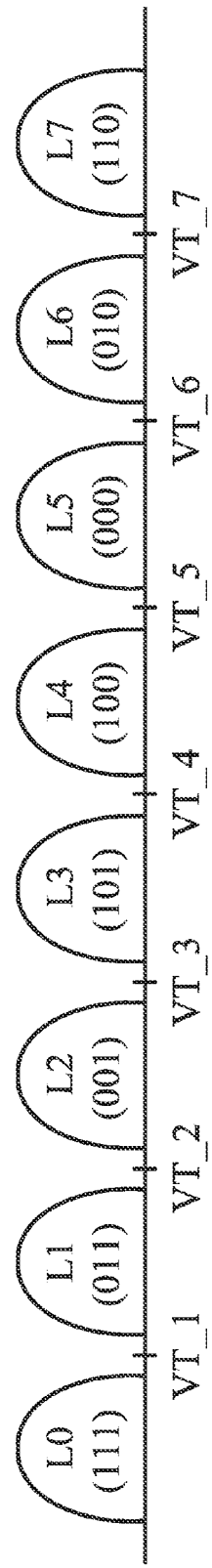
FIG. 2 is a diagram illustrating a first exemplary threshold voltage distribution of the physical page P_0 to be read.

Please refer to FIG. 2, which is a diagram illustrating a first exemplary threshold voltage distribution of the physical page P_0 to be read. The memory cells M_0-M_K of the physical page P_0 may include memory cells with floating gates programmed to have an electrical charge level L0 (i.e., (MSB, CSB, LSB)=(1, 1, 1)), memory cells with floating gates programmed to have an electrical charge level L1 (i.e., (MSB, CSB, LSB)=(0, 1, 1)), memory cells with floating gates programmed to have an electrical charge level L2 (i.e., (MSB, CSB, LSB)=(0, 0, 1)), memory cells with floating gates programmed to have an electrical charge level L3 (i.e., (MSB, CSB, LSB)=(1, 0, 1)), memory cells with floating gates programmed to have an electrical level L4 (i.e., (MSB, CSB, LSB)=(1, 0, 0)), memory cells with floating gates programmed to have an electrical level L5 (i.e., (MSB, CSB, LSB)=(0, 0, 0)), memory cells with floating gates programmed to have an electrical charge level L6 (i.e., (MSB, CSB, LSB)=(0, 1, 0)), and memory cells with floating gates programmed to have an electrical charge level L7 (i.e., (MSB, CSB, LSB)=(1, 1, 0)).

To identify LSBs of the memory cells M_0-M_K, the flash memory 1100 sets the control gate voltage VG_0 by the threshold voltage VT_4 shown in FIG. 2. Next, the conductive state of each memory cell of the target physical page P_0 indicates whether the memory cell has an LSB being "0" or "1". In this exemplary embodiment, when a memory cell of the physical page P_0 is turned on by the threshold voltage VT_4 applied to its control gate, the flash memory 1100 will output one binary digit "1" representative of the LSB; otherwise, the flash memory 1100 will output the other binary digit "0" representative of the LSB.

To identify CSBs of the memory cells M_0-M_K, the flash memory 1100 sets the control gate voltage VG_0 by the threshold voltages VT_2 and VT_6 shown in FIG. 2, respectively. Similarly, the conductive state of each memory cell of the target physical page P_0 indicates whether the memory cell 1100 has a CSB being "0" or "1". In this exemplary embodiment, when the memory cell is turned on by any of the threshold voltages VT_2 and VT_6 applied to its control gate, the flash memory 1100 will output the binary digit "1" representative of the CSB; when the memory cell is not turned on by the threshold voltage VT_2 applied to its control gate and is turned on by the other threshold voltage VT_6 applied to its control gate, the flash memory 1100 will output the binary digit "0" representative of the CSB; and when the memory cell is neither turned on by the threshold voltage VT_2 applied to its control gate nor turned on by the other threshold voltage VT_6 applied to its control gate, the flash memory 1100 will output the binary digit "1" representative of the CSB.

To identify MSBs of the memory cells M_0-M_K, the flash memory 1100 sets the control gate voltage VG_0 by the threshold voltages VT_1, VT_3, VT_5, and VT_7 shown in FIG. 2, respectively. Similarly, the conductive state of each memory cell of the target physical page P_0 indicates whether the memory cell has an MSB being "0" or "1". In this exemplary embodiment, when the memory cell is turned on by any of the threshold voltages VT_1, VT_3, VT_5, and VT_7 applied to its control gate, the flash memory 1100 will output the binary digit "1" representative of the MSB; when the memory cell is not turned on by the threshold voltage VT_1 applied to its control gate and is turned on by any of the threshold voltages VT_3, VT_5, and VT_7 applied to its control gate, the flash memory 1100 will output the binary digit "0" representative of the MSB; when the memory cell is not turned on by any of the threshold voltages VT_1 and VT_3 applied to its control gate and is turned on by any of the threshold voltages VT_5 and VT_7 applied to its control gate, the flash memory 1100 will output the binary digit "1" representative of the MSB; when the memory cell is not turned on by any of the threshold voltages VT_1, VT_3, and VT_5 applied to its control gate and is turned on by the threshold voltage VT_7 applied to its control gate, the flash memory 1100 will output the binary digit "0" representative of the MSB; and when the memory cell is not turned on by any of the threshold voltages VT_1, VT_3, VT_5, and VT_7 applied to its control gate, the flash memory 1100 will output the binary digit "1" representative of the MSB.

Figure 3:
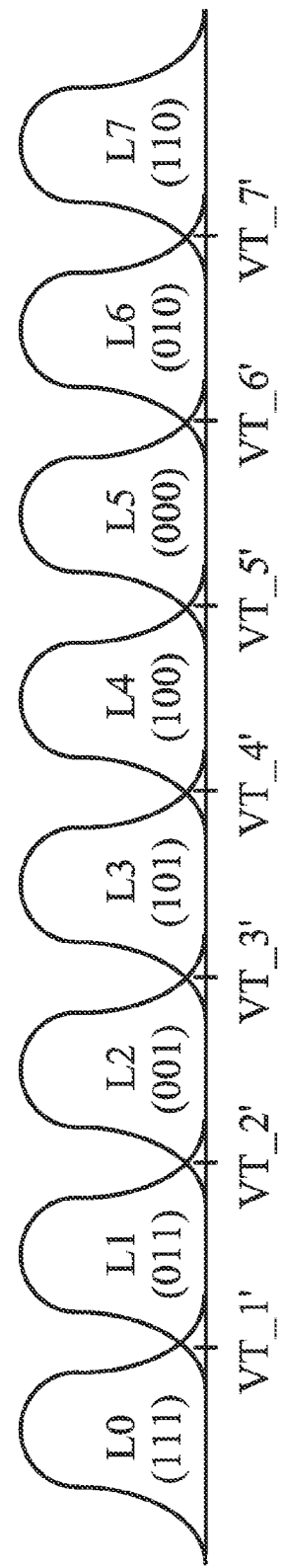
FIG. 3 is a diagram illustrating a second exemplary threshold voltage distribution of the physical page P_0 to be read.

However, the threshold voltage distribution shown in FIG. 2 may be changed to become another threshold voltage distribution due to certain factors such as the increase of the P/E count and/or the retention time. For example, the lobe-shaped distribution corresponding to each electrical charge level may be widened and/or shifted. Please refer to FIG. 3, which is a diagram illustrating a second exemplary threshold voltage distribution of the physical page P_0 to be read. As can be seen from FIG. 3, the threshold voltage distribution is different from that shown in FIG. 2. Setting the control gate voltage VG_0 by the aforementioned threshold voltages VT_1-VT_7 may fail to obtain the correct LSBs, CSBs, and MSBs of the memory cells M_0-M_K of the target physical page P_0. Specifically, when the memory cells M_0-M_K have the threshold voltage distribution shown in FIG. 3, new threshold voltages VT_1'-VT_7' should be used for obtaining the stored information correctly. As a result, an error correction code (ECC) operation performed upon the codeword read from memory cells M_0-M_K may fail due to uncorrectable errors presented in the codeword. In this exemplary embodiment, the memory controller 1200 is devised to perform soft decode upon the codeword read from memory cells M_0-M_K for enhancing the decoding capability. Details are described as below.

Please refer to FIG. 1 again. The memory controller 1200 is implemented to control access (read/write) of the flash memory 102, and includes, but is not limited to, a control logic 1210 and an ECC circuit 1220 having ECC decoder 1222 and ECC encoder 1229. Please note that only the elements pertinent to the technical features of the present invention are shown in FIG. 1. That is, the memory controller 1200 may include additional elements to support other functionality. Generally, when receiving a read request for data stored in the memory cells M_0-M_K of the target physical page P_0, the control logic 1210 is operative for controlling the flash memory 1100 to read requested data. Next, when the flash memory 1100 successfully identifies all bits stored in each of the memory cells M_0-M_K, the readout information which includes identified bits of the memory cells M_0-M_K is received by the control logic 1210. As known to those skilled in the art, part of the memory cells 1110 of one physical page is utilized for storing ECC information (e.g., an ECC code). Thus, the ECC circuit 1220 is operative to perform an ECC operation upon the readout information (e.g., a codeword) obtained from the flash memory 1100. In this exemplary embodiment, the ECC circuit 1220 includes an ECC decoder 1222 and an ECC encoder 1229. The ECC decoder 1222 is implemented for checking the correctness of the readout information, thereby detecting the existence of any error bits. The ECC decoder 1222 is also operative for correcting error bits found in the checked readout information. However, when the number of error bits existing in the readout information exceeds a maximum number of error bits that can be corrected by the ECC decoder 1222 in the way of hard decode (e.g. BCH, Bos, Ray-Chaudhuri, Hocquenghem code), the ECC decoder 1222 indicates the control logic 1210 that the readout information includes uncorrectable error bits. Thus, the control logic 1210 will enable the soft read mechanism for obtaining the soft information which can be utilized by the ECC decoder 1222 for performing the soft decode mechanism. Details are described as below.

In this exemplary embodiment, the ECC decoder 1222 may be implemented by a low density parity-check (LDPC) decoder. The control logic 1210 controls the flash memory 1100 to provide soft information to be decoded by the LDPC decoder. Therefore, under the control of the control logic 1210, the flash memory 1100 outputs multiple binary digits to serve as one soft bit read from each of the memory cells M_0-M_K. Specifically, the control logic 1210 is arranged for controlling the flash memory 1100 to perform a plurality of read operations (e.g., seven read operations) upon each of the memory cells M_0-M_K of the target physical page P_0 when reading LSB data, CSB data, or MSB data.

Figure 4:
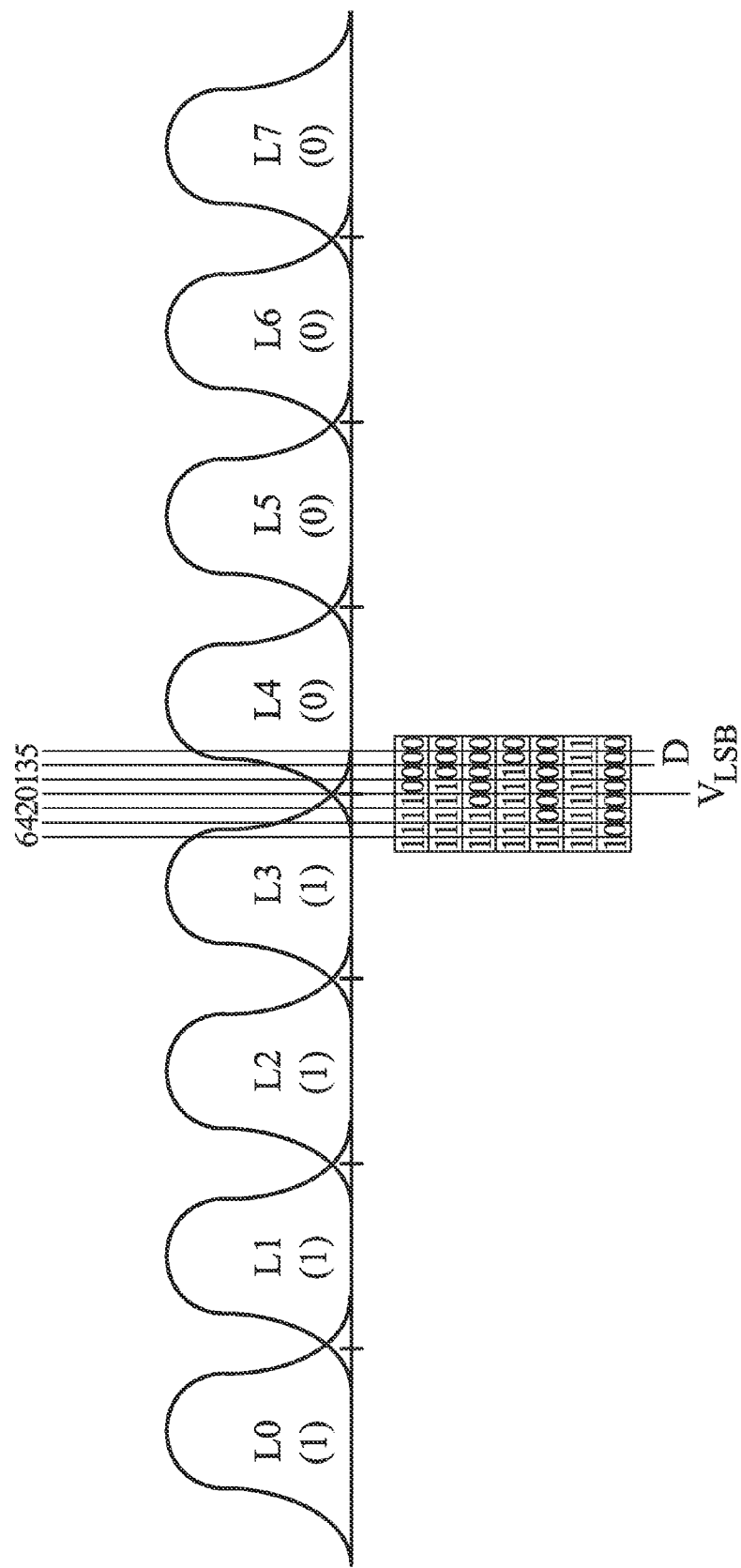
FIG. 4, which is a diagram illustrating an exemplary LSB reading operation of reading a soft bit from a memory cell of the flash memory 102.

Please refer to FIG. 4, which is a diagram illustrating an exemplary LSB reading operation of reading a soft bit (i.e., a soft information value) from a memory cell of the flash memory 102. In accordance with the exemplary threshold voltage distributions shown in FIG. 2 and FIG. 3, a memory cell with any of the electrical charge levels L0-L3 would store LSB=1, and a memory cell with any of the electrical charge levels L4-L7 would store LSB=0. In this exemplary embodiment, the control logic 1210 determines an initial control gate voltage VLSB and a voltage spacing D, and then controls the flash memory 1100 to perform seven read operations upon each of the memory cells M_0-M_K. Based on the voltage adjusting order OD1, the flash memory 1100 sets the control gate voltage VG_0 by VLSB, VLSB+D, VLSB−D, VLSB+2D, VLSB−2D, VLSB+3D, VLSB−3D, sequentially. Therefore, each of the bit sequences BS_0-BS_M would have seven binary digits sequentially obtained due to the applied control gate voltages VLSB, VLSB+D, VLSB−D, VLSB+2D, VLSB−2D, VLSB+3D and VLSB−3D. Please note that each of the bit sequences BS_0-BS_M acts as a soft bit representative of the soft information read from a memory cell, and the binary digit obtained due to the initial control gate voltage VLSB may serve as a sign bit (i.e., a hard bit value). The read operation utilizing the initial control gate voltage VLSB can be deemed as a normal read operation. The read operations utilizing the control gate voltages VLSB+D, VLSB−D, VLSB+2D, VLSB−2D, VLSB+3D, VLSB−3D can be deemed as reread operations 1-6, respectively.

In this exemplary embodiment, each bit sequence may have one of eight possible binary digit combinations BS1-BS8. When the electrical charge currently stored on the floating gate of the memory cell makes the threshold voltage of the memory cell higher than VLSB+3D, the bit sequence read from the memory cell would have the binary digit combination BS8="0000000". When the electrical charge currently stored on the floating gate of the memory cell makes the threshold voltage of the memory cell located between VLSB+2D and VLSB+3D, the bit sequence read from the memory cell would have the binary digit combination BS7="0000010". When the electrical charge currently stored on the floating gate of the memory cell makes the threshold voltage of the memory cell located between VLSB+D and VLSB+2D, the bit sequence read from the memory cell would have the binary digit combination BS6="0001010". When the electrical charge currently stored on the floating gate of the memory cell makes the threshold voltage of the memory cell located between VLSB and VLSB+D, the bit sequence read from the memory cell would have the binary digit combination BS5="0101010". When the electrical charge currently stored on the floating gate of the memory cell makes the threshold voltage of the memory cell lower than VLSB−3D, the bit sequence read from the memory cell would have the binary digit combination BS1="1111111". When the electrical charge currently stored on the floating gate of the memory cell makes the threshold voltage of the memory cell located between VLSB−2D and VLSB−3D, the bit sequence read from the memory cell would have the binary digit combination BS2="1111110". When the electrical charge currently stored on the floating gate of the memory cell makes the threshold voltage of the memory cell located between VLSB−D and VLSB−2D, the bit sequence read from the memory cell would have the binary digit combination BS3="1111010". When the electrical charge currently stored on the floating gate of the memory cell makes the threshold voltage of the memory cell located between VLSB and VLSB−D, the bit sequence read from the memory cell would have the binary digit combination BS4="1101010".

When all of the binary digits included in a bit sequence are 1's, this means that the corresponding memory cell has the electrical charge level L0, L1, L2, or L3, and the reliability of LSB=1 may be high. When all of the binary digits included in a bit sequence are 0's, this means that the corresponding memory cell has the electrical charge level L5, L6, L7, or L8, and the reliability of LSB=0 may be high. However, when a bit sequence has different binary digits "0" and "1" included therein, this means that the corresponding memory cell has the electrical charge level L3 or L4. As the threshold voltage of the corresponding memory cell is between VLSB−3D and VLSB+3D, the reliability of LSB=1/LSB=0 may be low due to the fact that the error probability may be high. For example, a memory cell which originally stores LSB=0 would have an amount of stored electrical charge corresponding to the electrical charge level L4 to make the threshold voltage higher than VLSB+3D. Comparing to the hard decode, the reliability contained in the soft information value will enhance the possibility of obtaining the correct codeword during performing soft decode. However, the soft information value may comprise multiple binary digits, as mentioned above 7 binary digits, obtained in the normal read operation and sequential reread operations 1-6. For performing soft decode, the ECC decoder 1222 has to obtain and store the complete soft information value. Thus, the ECC decoder 1222 requires a huge storage space to store the complete soft information value. That will increase chip size and cost.

For reducing the storage space, the binary digits obtained from the read operations shall be encoded as a shorter codeword before storing or decoding. Please refer to FIG. 1 again. As mentioned above, the ECC circuit 1220 is operative to perform the ECC operation upon the readout information obtained from the flash memory 1100, and, the ECC decoder 1222 is implemented for checking the correctness of the readout information, thereby detecting the existence of any error bits. In addition, the ECC decoder 1222 further comprises encoder 1223, storage device 1227, and decoding unit 1228. The encoder 1223 is for generating a shorter codeword for representing the binary digits read from the flash memory 1100 according to the binary digits. The storage device 1227 is for storing the codeword generated by the encoder 1223 and for providing the stored codeword to the decoding unit 1228. The decoding unit 1228 is for performing an error correction operation upon the codeword. Details are described as below.

In one exemplary embodiment, the control logic 1210 controls the flash memory 1100 to perform a read operation with an initial control gate voltage VLSB upon the memory cells, e.g. memory cells M_0-M_K of physical page P_0, to identify LSBs of the memory cells M_0-M_K. The read operation performed with the initial control gate voltage VLSB can be deemed as a normal read operation. The flash memory 1100 provides a page of binary digits, comprising a data portion, a spare portion, and at least one parity portion, to the control logic 1210. The control logic 1210 transmits the received binary digits to the ECC circuit 1220. In one embodiment, the ECC circuit 1220 divides the received binary digits into two parts. A first part comprises the data portion and corresponding parity portion(s). A second part comprises a spare portion and corresponding parity portion(s). The ECC circuit performs a soft decode operation upon the first part, and perform a hard decode operation upon the second part. This is, however, for illustration purposes only and not a limitation of the present invention. Performing the soft decode operation or hard decode operation upon any portion of the page of binary digits is still covered by the scope of the present invention. In this embodiment, the encoder 1223 generates a codeword according to the first part of the binary digits. Further details are illustrated below.

Figure 5:
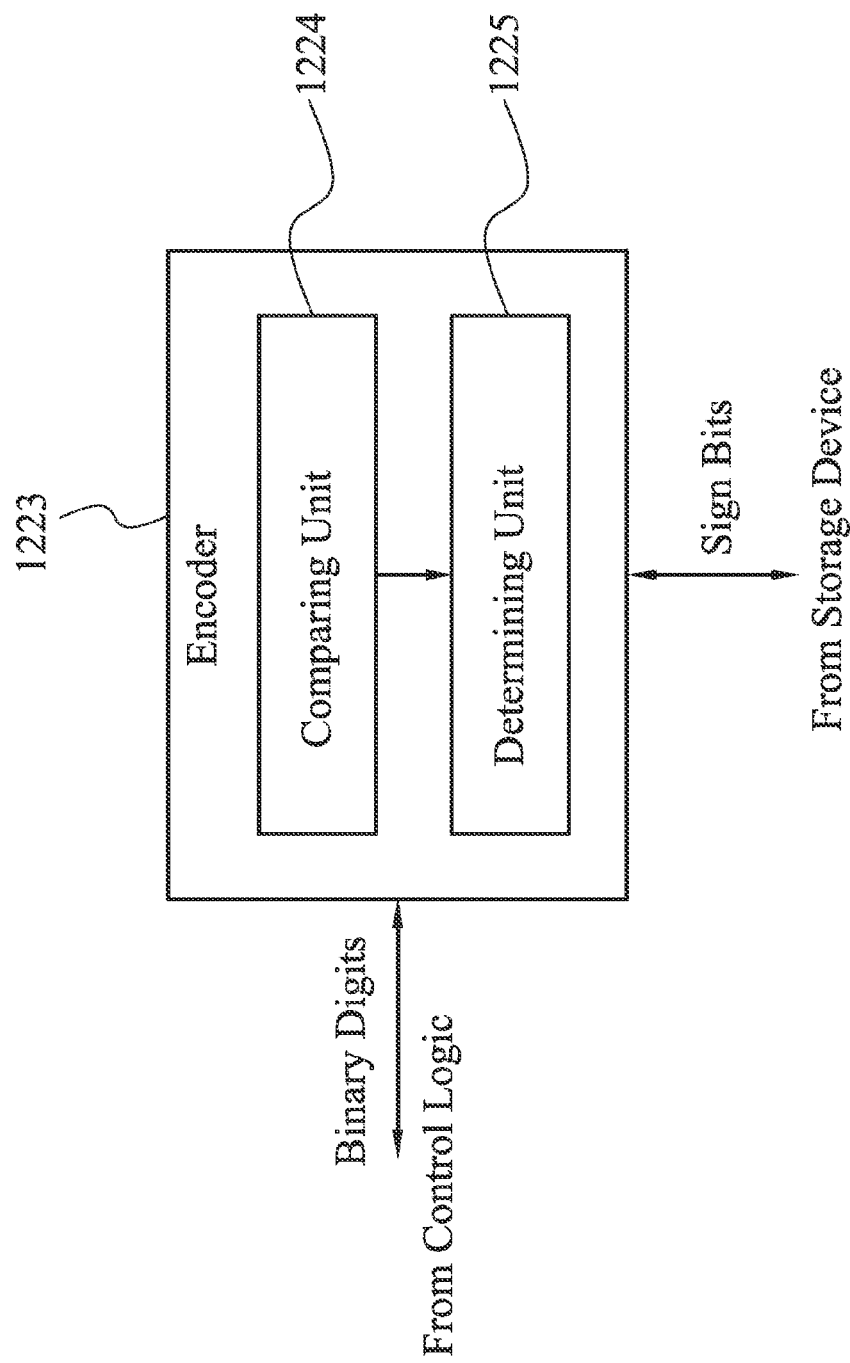
FIG. 5 is an exemplary block diagram of the encoder shown in FIG. 1.
Figure 6:
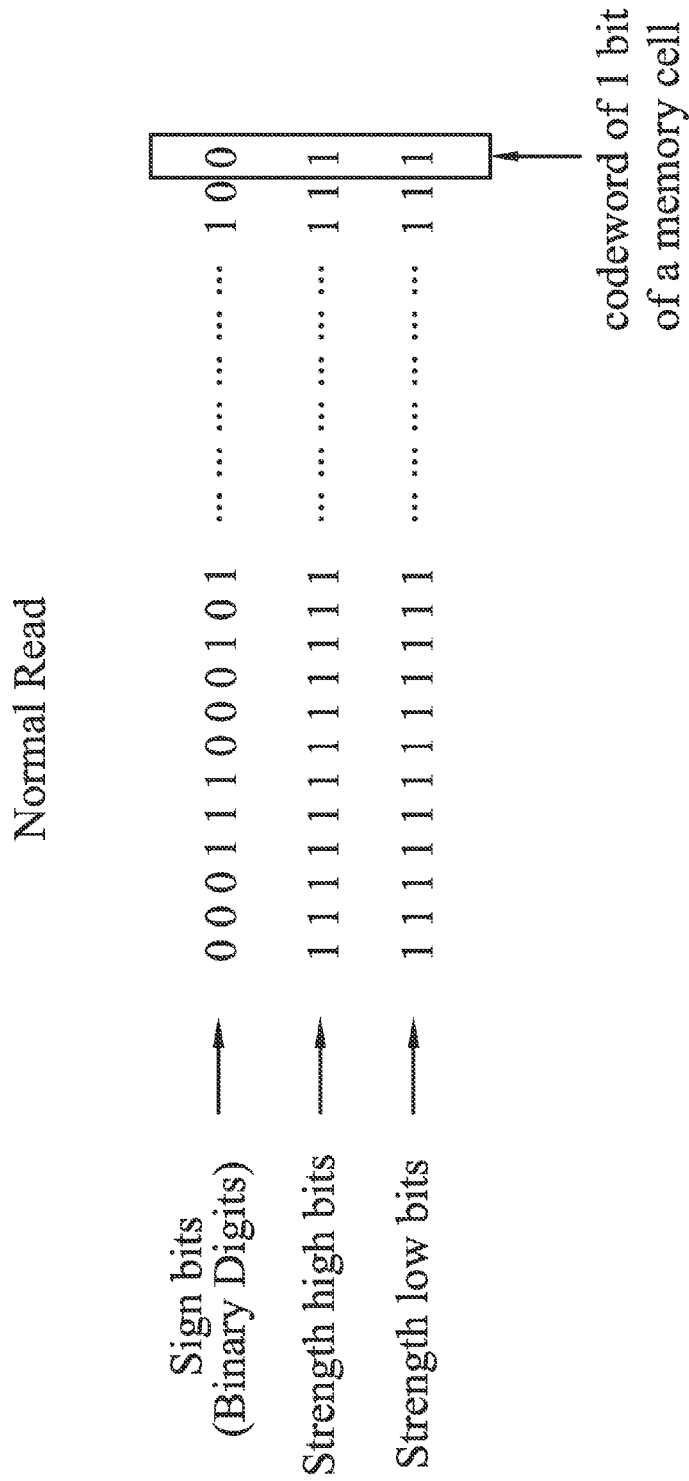
FIG. 6 is an exemplary diagram illustrating encoding the binary digits read from the flash memory cells.

Please further refer to FIG. 5 and FIG. 6. FIG. 5 is an exemplary block diagram of the encoder shown in FIG. 1. FIG. 6 is an exemplary diagram illustrating encoding the binary digits read from the flash memory cells. The encoder 1223 comprises a comparing unit 1224 and a determining unit 1225. Please note that only the elements pertinent to the technical features of the present invention are shown in FIG. 5. That is, the encoder 1223 may include additional elements to support other functionality. The comparing unit 1224 is for comparing the first part of the binary digits sent from the control logic 1210 with the sign bits stored in the storage device 1227. While reading a target physical page (e.g. physical pages P_0), the control logic 1210 controls the flash memory 1100 to perform a read operation with an initial control gate voltage VLSB upon the memory cells, e.g. memory cells M_0-M_K of physical page P_0, to identify LSBs of the memory cells M_0-M_K. The first part of the binary digits, as shown in FIG. 6, of the physical page is sent to the encoder unit 1223. Please note that each bit of the binary digits represents hard information of a LSB of a memory cell of the physical page P_0. For example, the left most binary digit of the binary digits is "1" and represents hard information of the LSB of the memory cell M_0 of the physical page P_0, and the binary digit next to the left most binary digit of the binary digits is "1" and represents hard information of the LSB of the memory cell M_1 of the physical page P_0, and so on. Since the first part of the binary digits are obtained under the read operation with the initial control gate voltage VLSB upon the memory cells, the binary digits should be deemed as the sign bits of the memory cells. For example, the left most binary digit of the binary digits of the physical page P_0 is "1", which means the sign bit of the memory cell M_0 is "1". Accordingly, The encoder 1223 generates (sets) a strength high bit "1" and a strength low bit "1" for representing the reliability of the sign bit "1" with a highest reliability. In other words, the memory cell M_0 is presumed as "1" and has a highest reliability. In addition, the codeword "111", comprising hard information "1" and soft information "11", is determined for representing the memory cell M_0. The codeword for representing the other memory cells is also determined in the similar way. Then, the codeword of the first part of the binary digits is sent to the storage device 1227. The storage device 1227 provides the codeword to the decoding unit 1228 for performing an error correction operation. If the error correction operation indicates the codeword is correct or correctable (in other words, data stored in the memory cells can be correctly obtained), the ECC circuit 1220 informs the result to the control logic 1210 and provides the correct data to the control logic 1210. If the error correction operation indicates the codeword is not correctable (in other words, data stored in the memory cells can not be correctly obtained), the ECC circuit 1220 informs the result to the control logic 1210, and the control logic 1210 controls the flash memory 1100 to perform a reread operation with a control gate voltage VLSB+D (D, a predetermined voltage spacing) upon the memory cells. Further details are illustrated below.

Figure 7:
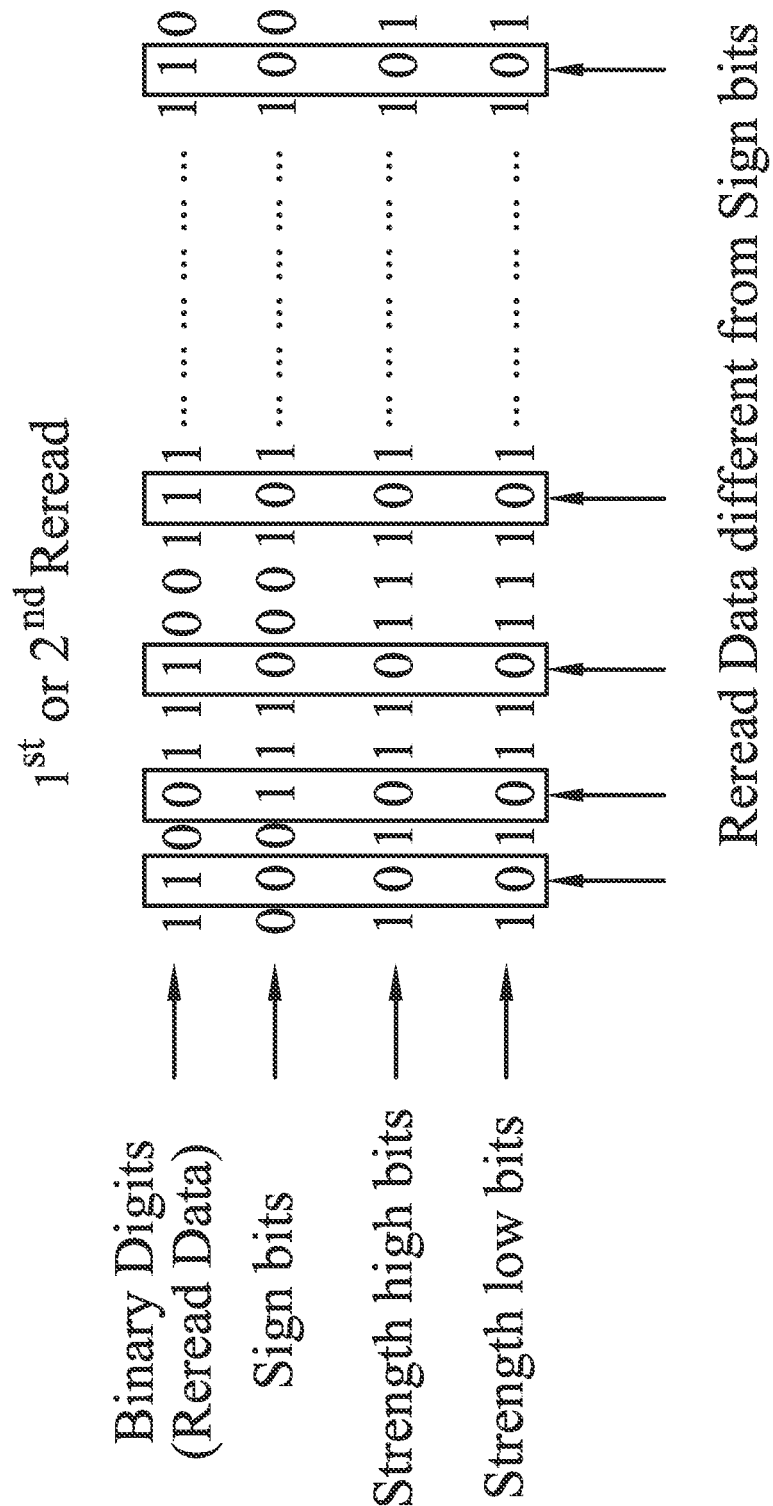
FIG. 7 is an exemplary diagram illustrating encoding the binary digits read from the flash memory cells for obtaining correct data.

Please refer to FIG. 7, FIG. 7 is an exemplary diagram illustrating encoding the binary digits read from the flash memory cells for obtaining a correct data. While reading a target physical page (e.g. physical pages P_0), the control logic 1210 controls the flash memory 1100 to perform a read operation with a second control gate voltage VLSB+D upon the memory cells, e.g. memory cells M_0-M_K of physical page P_0, to identify LSBs of the memory cells M_0-M_K. This reread operation can be deemed as 1st reread operation. The first part of the binary digits, as shown in FIG. 7, of the physical page is sent to the encoder unit 1223. Please note that each bit of the binary digits represents soft information of a LSB of a memory cell of the physical page P_0. For example, the left most binary digit of the binary digits is "1" and represents soft information of the LSB of the memory cell M_0 of the physical page P_0, and the binary digit next to the left most binary digit of the binary digits is "0" and represents soft information of the LSB of the memory cell M_1 of the physical page P_0, and so on. Please note that the binary digits (the reread data) shown in FIG. 7 may not be exactly the same as the sing bits. Since the control gate voltage for performing the 1st reread operation is VLSB+D, reading those memory cells whose threshold voltage falls between VLSB to VLSB+D with the control gate voltage VLSB and the control gate voltage VLSB+D may have a different result. For example, the sign bit, obtained with the control gate voltage VLSB, of the LSB of the memory cell M_1 is "0" and the soft information, obtained with the control gate voltage VLSB+D, of the LSB of the memory cell M_1 is "1". Hence, the encoder 1223 should update the reliability of the codeword of the LSB of the memory cell M_1. Further details are illustrated below.

The reread data (binary digits) obtained with the control gate voltage VLSB+D is sent to the comparing unit 1224. The comparing unit 1224 accesses the sign bits stored in the storage device 1227 and compares the sign bits with the reread data for updating the codeword. If the sign bit is the same as the corresponding binary digit, the comparing unit 1224 indicates the result to the determining unit 1225, and the determining unit 1225 determines to maintain the reliability of the sign bit. In other words, codeword for representing the corresponding memory cells is not changed. If the sign bit is not the same as the corresponding binary digit, the comparing unit 1224 indicates the result to the determining unit 1225, and the determining unit 1225 determines to update the reliability of the sign bit with a lowest reliability. In other words, codeword for representing the corresponding memory cells is changed. For example, the sign bit, obtained with the control gate voltage VLSB, of the LSB of the memory cell M_1 is "0" and the soft information, obtained with the control gate voltage VLSB+D, of the LSB of the memory cell M_1 is "1". Accordingly, The determining unit 1225 determining a strength high bit "0" and a strength low bit "0" for representing the reliability of the sign bit "1" with a lowest reliability. In other words, the LSB of the memory cell M_0 is updated as "0" and has a lowest reliability. In addition, the codeword "000", comprising hard information "0" and soft information "00", is determined for representing the LSB of the memory cell M_0. The codeword for representing the other memory cells is also determined in the similar way. Then, the updated codeword of the first part of the binary digits is sent to the storage device 1227 for updating the original codeword. The storage device 1227 provides the updated codeword to the decoding unit 1228 for performing an error correction operation. If the error correction operation indicates the updated codeword is correct or correctable (in other words, data stored in the memory cells can be correctly obtained), the ECC circuit 1220 informs the result to the control logic 1210 and provides the correct data to the control logic 1210. If the error correction operation indicates the updated codeword is not correctable (in other words, data stored in the memory cells can not be correctly obtained), the ECC circuit 1220 informs the result to the control logic 1210, and the control logic 1210 controls the flash memory 1100 to perform a reread operation with a control gate voltage VLSB−D upon the memory cells. The reread operation with a control gate voltage VLSB−D upon the memory cells can be deemed as a 2nd reread operation. Please note that the voltage spacing of the normal read operation and 1st reread operation is the same as the voltage spacing of the normal read operation and 2nd reread operation. Hence, the rule of updating the reliability of the codeword should be similar. The details of generating and storing the codeword according to the reread data obtained in the 2nd reread operation are omitted. If the error correction operation indicates the updated codeword obtained in the 2nd reread operation is correct or correctable (in other words, data stored in the memory cells can be correctly obtained), the ECC circuit 1220 informs the result to the control logic 1210 and provides the correct data to the control logic 1210. If the error correction operation indicates the updated codeword obtained in the 2nd reread operation is not correctable (in other words, data stored in the memory cells can not be correctly obtained), the ECC circuit 1220 informs the result to the control logic 1210, and the control logic 1210 controls the flash memory 1100 to perform a reread operation with a control gate voltage VLSB+2D upon the memory cells. The reread operation with a control gate voltage VLSB+2D upon the memory cells can be deemed as a 3rd reread operation. Further details are illustrated below.

Figure 8:
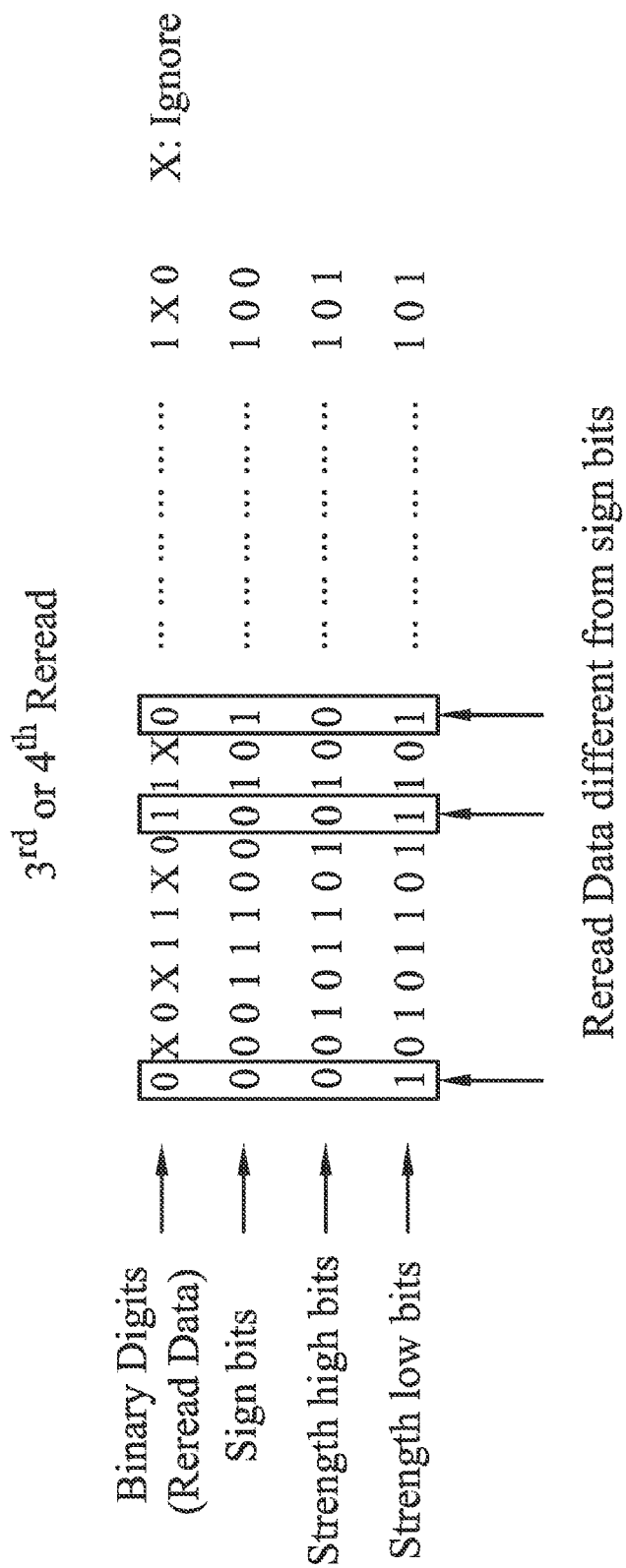
FIG. 8 is an exemplary diagram illustrating encoding the binary digits read from the flash memory cells for obtaining correct data.

Please refer to FIG. 8, FIG. 8 is an exemplary diagram illustrating encoding the binary digits read from the flash memory cells for obtaining a correct data. While reading a target physical page (e.g. physical pages P_0), the control logic 1210 controls the flash memory 1100 to perform a read operation with a third control gate voltage VLSB+2D upon the memory cells, e.g. memory cells M_0-M_K of physical page P_0, to identify LSBs of the memory cells M_0-M_K. This reread operation can be deemed as 3rd reread operation. The first part of the binary digits, as shown in FIG. 8, of the physical page is sent to the encoder unit 1223. Please note that each bit of the binary digits represents soft information of a LSB of a memory cell of the physical page P_0. For example, the left most binary digit of the binary digits is "0" and represents soft information of the LSB of the memory cell M_0 of the physical page P_0. Please note that the binary digits (the reread data) shown in FIG. 8 may not be exactly the same as the sign bits. Since the control gate voltage for performing the 3rd reread operation is VLSB+2D, reading those memory cells whose threshold voltage falls between VLSB to VLSB+2D with the control gate voltage VLSB and the control gate voltage VLSB+2D may have a different result. For example, the sign bit, obtained with the control gate voltage VLSB, of the LSB of the memory cell M_0 is "0" and the soft information, obtained with the control gate voltage VLSB+2D, of the LSB of the memory cell M_0 is "1". Hence, the encoder 1223 should update the reliability of the codeword of the LSB of the memory cell M_0. Further details are illustrated below.

The reread data (binary digits) obtained with the control gate voltage VLSB+2D is sent to the comparing unit 1224. The comparing unit 1224 accesses the sign bits stored in the storage device 1227 and compares the sign bits with the reread data for updating the codeword. Please note that some binary digits were found being different from the corresponding sign bits in 1st or 2nd reread operation. The reliability of those binary digits should not be updated again. The comparing unit 1224 may ignore those binary digits. The determining unit 1225 maintains the reliability of the updated codeword. In other words, the determining unit 1225 maintains the strength high bits and strength low bits when the strength high bits and strength low bits had been updated. If the sign bit is the same as the corresponding binary digit, the comparing unit 1224 indicates the result to the determining unit 1225, and the determining unit 1225 determines to maintain the reliability of the sign bit. In other words, codeword for representing the corresponding memory cells is not changed. If the sign bit is not the same as the corresponding binary digit, the comparing unit 1224 indicates the result to the determining unit 1225, and the determining unit 1225 determines to update the reliability of the sign bit with a lowest reliability. In other words, codeword for representing the corresponding memory cells is changed. For example, the sign bit, obtained with the control gate voltage VLSB, of the LSB of the memory cell M_0 is "0" and the soft information, obtained with the control gate voltage VLSB+2D, of the LSB of the memory cell M_0 is "1". Accordingly, the determining unit 1225 determines a strength high bit "0" and a strength low bit "1" for representing the reliability of the sign bit "1" with a higher reliability. In other words, the LSB of the memory cell M_0 is updated as "0" and has a higher reliability. In addition, the codeword "001", comprising hard information "0" and soft information "01", is determined for representing the LSB of the memory cell M_0. The codeword for representing the other memory cells is also determined in the similar way. Then, the updated codeword of the first part of the binary digits is sent to the storage device 1227 for updating the original codeword. The storage device 1227 provides the updated codeword to the decoding unit 1228 for performing an error correction operation. If the error correction operation indicates the updated codeword is correct or correctable (in other words, data stored in the memory cells can be correctly obtained), the ECC circuit 1220 informs the result to the control logic 1210 and provides the correct data to the control logic 1210. If the error correction operation indicates the updated codeword is not correctable (in other words, data stored in the memory cells can not be correctly obtained), the ECC circuit 1220 informs the result to the control logic 1210, and the control logic 1210 controls the flash memory 1100 to perform a reread operation with a control gate voltage VLSB−D upon the memory cells. Further details are illustrated below.

The reread operation with a control gate voltage VLSB−2D upon the memory cells can be deemed as a 4th reread operation. Please note that the voltage spacing of the normal read operation and 3rd reread operation is the same as the voltage spacing of the normal read operation and 4th reread operation. Hence, the rule of updating the reliability of the codeword should be similar. The details of generating the codeword according to the reread data obtained in the 4th reread operation are omitted. If the error correction operation indicates the updated codeword obtained in the 4th reread operation is correct or correctable (in other words, data stored in the memory cells can be correctly obtained), the ECC circuit 1220 informs the result to the control logic 1210 and provides the correct data to the control logic 1210. If the error correction operation indicates the updated codeword obtained in the 4th reread operation is not correctable (in other words, data stored in the memory cells can not be correctly obtained), the ECC circuit 1220 informs the result to the control logic 1210, and the control logic 1210 controls the flash memory 1100 to perform a reread operation with a control gate voltage VLSB+3D upon the memory cells. The reread operation with a control gate voltage VLSB+3D upon the memory cells can be deemed as a 5th reread operation. Further details are illustrated below.

Figure 9:
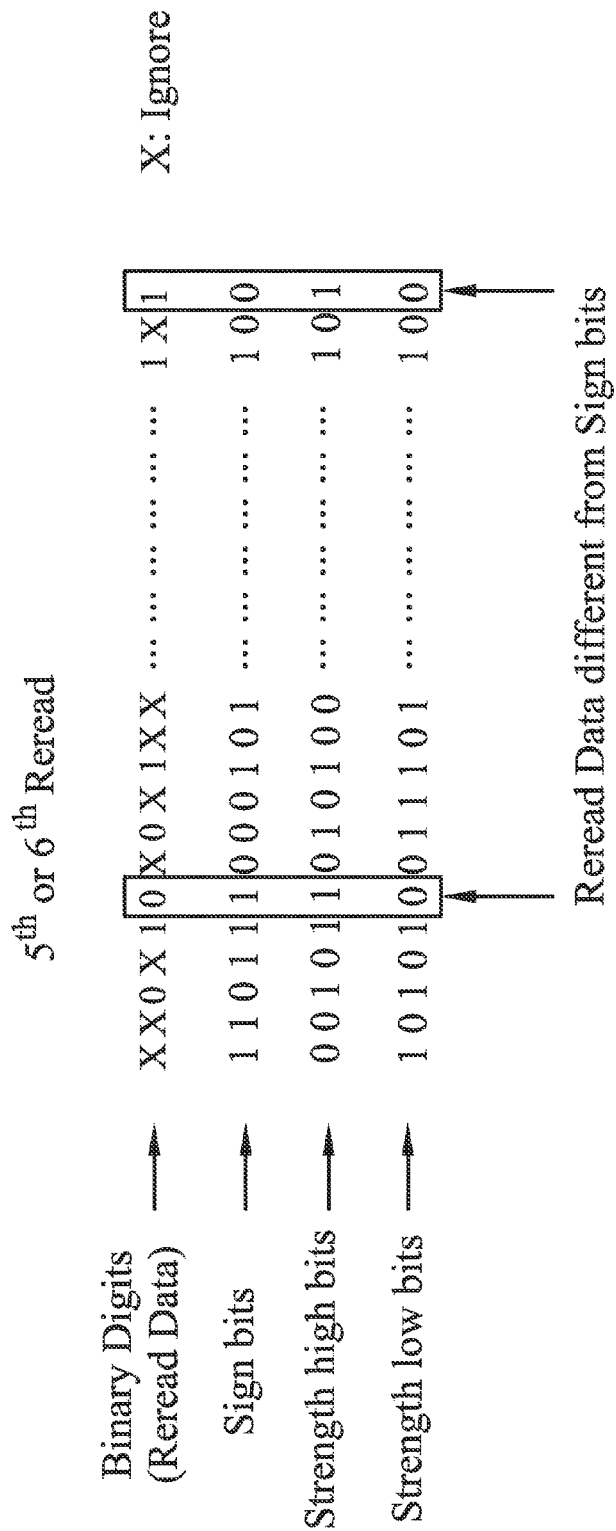
FIG. 9 is an exemplary diagram illustrating encoding the binary digits read from the flash memory cells for obtaining correct data.

Please refer to FIG. 9, FIG. 9 is an exemplary diagram illustrating encoding the binary digits read from the flash memory cells For obtaining a correct data, While reading a target physical page (e.g. physical pages P_0), the control logic 1210 controls the flash memory 1100 to perform a read operation with a fifth control gate voltage VLSB+3D upon the memory cells, e.g. memory cells M_0-M_K of physical page P_0, to identify LSBs of the memory cells M_0-M_K. This reread operation can be deemed as 5th reread operation. The first part of the binary digits, as shown in FIG. 9, of the physical page is sent to the encoder unit 1223. Please note that each bit of the binary digits represents soft information of a LSB of a memory cell of the physical page P_0. For example, the right most binary digit of the binary digits is "0" and represents soft information of the LSB of the corresponding memory cell of the physical page P_0. Please note that the binary digits (the reread data) shown in FIG. 9 may not be exactly the same as the sign bits. Since the control gate voltage for performing the 5th reread operation is VLSB+3D, reading those memory cells whose threshold voltage falls between VLSB to VLSB+3D with the control gate voltage VLSB and the control gate voltage VLSB+3D may have a different result. For example, the sign bit, obtained with the control gate voltage VLSB, of the LSB of the memory cell M_k is "0" and the soft information, obtained with the control gate voltage VLSB+3D, of the LSB of the memory cell M_k is "1". Hence, the encoder 1223 should update the reliability of the codeword of the LSB of the memory cell M_k. Further details are illustrated below.

The reread data (binary digits) obtained with the control gate voltage VLSB+3D is sent to the comparing unit 1224. The comparing unit 1224 accesses the sign bits stored in the storage device 1227 and compares the sign bits with the reread data for updating the codeword. Please note that some binary digits were found being different from the corresponding sign bits in 1st, 2nd, 3rd, or 4th reread operations. The reliability of those binary digits should not be updated again. The comparing unit 1224 may ignore those binary digits. The determining unit 1225 maintains the reliability of the updated codeword. In other words, the determining unit 1225 maintains the strength high bits and strength low bits when the strength high bits and strength low bits had been updated. If the sign bit is the same as the corresponding binary digit, the comparing unit 1224 indicates the result to the determining unit 1225, and the determining unit 1225 determines to maintain the reliability of the sign bit. In other words, codeword for representing the corresponding memory cells is not changed. If the sign bit is not the same as the corresponding binary digit, the comparing unit 1224 indicates the result to the determining unit 1225, and the determining unit 1225 determines to update the reliability of the sign bit with a lowest reliability. In other words, codeword for representing the corresponding memory cells is changed. For example, the sign bit, obtained with the control gate voltage VLSB, of the LSB of the memory cell M_k is "0" and the soft information, obtained with the control gate voltage VLSB+3D, of the LSB of the memory cell M_k is "1". Accordingly, the determining unit 1225 determines a strength high bit "1" and a strength low bit "0" for representing the reliability of the sign bit "0" with a higher reliability. In other words, the LSB of the memory cell M_k is updated as "0" and has a higher reliability. In addition, the codeword "010", comprising hard information "1" and soft information "01", is determined for representing the LSB of the memory cell M_0. The codeword for representing the other memory cells is also determined in the similar way. Then, the updated codeword of the first part of the binary digits is sent to the storage device 1227 for updating the original codeword. The storage device 1227 provides the updated codeword to the decoding unit 1228 for performing an error correction operation. If the error correction operation indicates the updated codeword is correct or correctable (in other words, data stored in the memory cells can be correctly obtained), the ECC circuit 1220 informs the result to the control logic 1210 and provides the correct data to the control logic 1210. If the error correction operation indicates the updated codeword is not correctable (in other words, data stored in the memory cells can not be correctly obtained), the ECC circuit 1220 informs the result to the control logic 1210, and the control logic 1210 controls the flash memory 1100 to perform a reread operation with a control gate voltage VLSB−3D upon the memory cells. Further details are illustrated below.

The reread operation with a control gate voltage VLSB−3D upon the memory cells can be deemed as a 6th reread operation. Please note that the voltage spacing of the normal read operation and 5rd reread operation is the same as the voltage spacing of the normal read operation and 6th reread operation. Hence, the rule of updating the reliability of the codeword should be similar. The details of generating the codeword according to the reread data obtained in the 6th reread operation are omitted. If the error correction operation indicates the updated codeword obtained in the 6th reread operation is correct or correctable (in other words, data stored in the memory cells can be correctly obtained), the ECC circuit 1220 informs the result to the control logic 1210 and provides the correct data to the control logic 1210. If the error correction operation indicates the updated codeword obtained in the 6th reread operation is not correctable (in other words, data stored in the memory cells can not be correctly obtained), the ECC circuit 1220 informs the result to the control logic 1210, and the control logic 1210 controls the flash memory 1100 to perform a reread operation with a control gate voltage VLSB+4D upon the memory cells. The reread operation with a control gate voltage VLSB+4D upon the memory cells can be deemed as a 7th reread operation. Otherwise, if the error correction operation indicates the updated codeword obtained in the 6th reread operation is not correctable, the ECC circuit 1220 informs the result to the control logic 1210, and the control logic 1210 determines a read fail upon the target physical page P_0 and reports the read fail to a host. The number of reread operation can be determined arbitrarily, and should not be a limitation of the present invention.

Please refer to FIG. 10. FIG. 10 is an exemplary diagram illustrating a mapping relation of the codeword and the threshold voltage of a memory cell. For example, while receiving hard information of a memory cell obtained with the initial control gate voltage VLSB, the encoder 1223 deems the hard information as a sign bit of LSB of the memory cell and presumes the sign bit with a highest reliability, e.g. codeword "011" for very strong "0" and codeword "111" for very strong "1". Otherwise, the memory cells whose threshold voltage is located between VLSB and VLSB+D determined in the 1st reread operation, should be mapped to very weak "0" and be encoded as "000". The memory cells whose threshold voltage is located between VLSB and VLSB−D, determined in the 2nd reread operation, should be mapped to very weak "1" and be encoded as "100". The memory cells whose threshold voltage is located between VLSB+D and VLSB+2D, determined in the 3rd reread operation, should be mapped to weak "0" and be encoded as "001". The memory cells whose threshold voltage is located between VLSB−D and VLSB−2D, determined in the 4th reread operation, should be mapped to weak "1" and be encoded as "101". The memory cells whose threshold voltage is located between VLSB+2D and VLSB+3D, determined in the 5th reread operation, should be mapped to strong "0" and be encoded as "010". The memory cells whose threshold voltage is located between VLSB−2D and VLSB−3D, determined in the 6th reread operation, should be mapped to weak "1" and be encoded as "110". Please note that the mapping relation of the codeword and the threshold voltage of a memory cell can be determined arbitrarily, as long as the reliability of the sign bit (hard information) can be recognized by different codeword. In addition, the codeword length of the codeword is 3 bits which is shorter than the binary digits (bit sequence) of a memory cell obtained in the normal read operation and 1st-6th reread operation. For example, a memory cell has a threshold voltage located between VLSB+2D and VLSB+3D. The binary digits of LSB of the memory cell obtained in the normal read operation and 1st-6th reread operation is "0000000" (binary digit combination BS8). The binary digits comprises 7 binary digits which is longer than the codeword length of the codeword. If the ECC decoder 1222 should store all the 7 binary digits for performing the ECC operation rather than storing the 3 bits codeword, the ECC decoder 1222 should have more memory space. Thus, encoding the binary digits obtained in different read operations as a shorter codeword can reduce the memory space, and the cost can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for reading data stored in a flash memory, wherein the flash memory comprises a plurality of memory cells and stores N bit(s) data in a memory cell of the memory cells by programming the memory cell to one voltage state of 2N voltage states, the method comprises:
controlling the flash memory to perform at least one read operation upon the memory cell to obtain at least one binary digit for representing a bit of the N bits data;
generating a codeword for representing the bit of the N bits data according to the at least one binary digit, wherein the codeword is different from the at least one binary digit;
providing the codeword to an error correction decoder for performing an error correction operation,
wherein the step of controlling the flash memory to perform the at least one read operation upon the memory cell to obtain the at least one binary digit for representing the bit of the N bits data further comprises:
controlling the flash memory to perform a first read operation with a first threshold voltage upon the memory cell to obtain a first binary digit of the at least one binary digit; and
wherein the step of generating the codeword for representing the bit of the N bits data according to the at least one binary digit further comprises:
determining the first binary digit as a sign bit of the codeword; and
generating at least one strength bit for representing a reliability of the sign bit.

2. The method of claim 1, wherein the step of providing the codeword to the error correction decoder for performing the error correction operation further comprising:
storing the codeword to a memory buffer; and
providing the codeword stored in the memory buffer to the error correction decoder for performing the error correction operation.

3. The method of claim 1, wherein the step of generating the at least one strength bit for representing the reliability of the sign bit further comprises:
setting the at least one strength bit with a highest reliability.

4. The method of claim 1, wherein the step of controlling the flash memory to perform the at least one read operation upon the memory cell to obtain the at least one binary digit for representing the bit of the N bits data further comprises:
controlling the flash memory to perform a second read operation with a second threshold voltage upon the memory cell to obtain a second binary digit of the at least one binary digit; and
wherein the step of generating the codeword for representing the bit of the N bits data according to the at least one binary digit further comprises:
comparing the second binary digit with the sign bit to generate the codeword.

5. The method of claim 4, wherein the step of comparing the second binary digit with the sign bit to generate the codeword further comprises:
   updating the at least one strength bit for adjusting the reliability of the sign bit when the second binary digit is different from the sign bit.

6. The method of claim 4, wherein the step of comparing the second binary digit with the sign bit to generate the codeword further comprises:
   maintaining the at least one strength bit when the at least one strength bit had been updated.

7. The method of claim 4, wherein the step of controlling the flash memory to perform the at least one read operation upon the memory cell to obtain the at least one binary digit for representing the bit of the N bits data further comprises:
   controlling the flash memory to perform a third read operation with a third threshold voltage upon the memory cell to obtain a third binary digit of the at least one binary digit, wherein a first voltage difference of the first threshold voltage and the second threshold voltage is smaller than a second voltage difference of the second threshold voltage and the third threshold voltage; and
   wherein the step of generating the codeword for representing the bit of the N bits data according to the at least one binary digit further comprises:
   updating the at least one strength bit with a higher reliability when the third binary digit is different from the sign bit.

8. The method of claim 1, wherein the binary digits comprises M binary digits, and M is greater than a codeword length of the codeword.

9. The method of claim 8, wherein the M binary digits are obtained from M read operations with M different threshold voltages.

10. A memory controller for reading data stored in a flash memory, wherein the flash memory comprises a plurality of memory cells and stores N bit(s) data in a memory cell of the memory cells by programming the memory cell to one voltage state of 2N voltage states, the memory controller comprises:
   a control logic for controlling the flash memory to perform at least one read operation upon the memory cell to obtain at least one binary digit for representing a bit of the N bits data;
   an encoder, coupled to the control logic, for generating a codeword for representing the bit of the N bits data according to the at least one binary digit, wherein the codeword is different from the at least one binary digit; and
   a memory buffer, coupled to the encoder, for storing the codeword and providing the codeword to an error correction decoder for performing an error correction operation,
   wherein the control logic is further for controlling the flash memory to perform a first read operation with a first threshold voltage upon the memory cell to obtain a first binary digit of the at least one binary digit; and
   wherein the encoder is further for determining the first binary digit as a sign bit of the codeword; and for generating at least one strength bit for representing a reliability of the sign bit.

11. The memory controller of claim 10, wherein the encoder is further for setting the at least one strength bit with a highest reliability.

12. The memory controller of claim 10, wherein the control logic is further for controlling the flash memory to perform a second read operation with a second threshold voltage upon the memory cell to obtain a second binary digit of the at least one binary digit; and
   wherein the encoder is further for comparing the second binary digit with the sign bit to generate the codeword.

13. The memory controller of claim 12, wherein the encoder is further for updating the at least one strength bit for adjusting the reliability of the sign bit when the second binary digit is different from the sign bit.

14. The memory controller of claim 12, wherein the encoder is further for maintaining the at least one strength bit when the at least one strength bit had been adjusted.

15. The memory controller of claim 12, wherein the control logic is further for controlling the flash memory to perform a third read operation with a third threshold voltage upon the memory cell to obtain a third binary digit of the at least one binary digit, wherein a first voltage difference of the first threshold voltage and the second threshold voltage is smaller than a second voltage difference of the second threshold voltage and the third threshold voltage; and
   wherein the encoder is further for updating the at least one strength bit with a higher reliability when the third binary digit is different from the sign bit.

16. The memory controller of claim 10, wherein the binary digits comprises M binary digits, and M is greater than a codeword length of the codeword.

17. The method of claim 16, wherein the M binary digits are obtained from M read operations with M different threshold voltages.

18. A system for reading data stored in a flash memory, wherein the flash memory comprises a plurality of memory cells and stores N bit(s) data in a memory cell of the memory cells by programming the memory cell to one voltage state of 2N voltage states, the system comprises:
   a control logic for controlling the flash memory to perform at least one read operation upon the memory cell to obtain at least one binary digit for representing a bit of the N bits data;
   an encoder, coupled to the control logic, for generating a codeword for representing the bit of the N bits data according to the at least one binary digit, wherein the codeword is different from the at least one binary digit; and
   a memory buffer, coupled to the encoder, for storing the codeword and providing the codeword to an error correction decoder for performing an error correction operation,
   wherein the control logic is further for controlling the flash memory to perform a first read operation with a first threshold voltage upon the memory cell to obtain a first binary digit of the at least one binary digit; and
   wherein the encoder is further for determining the first binary digit as a sign bit of the codeword; and for generating at least one strength bit for representing a reliability of the sign bit.

* * * * *